United States Patent
Saitoh et al.

(10) Patent No.: US 9,412,937 B2
(45) Date of Patent: Aug. 9, 2016

(54) MEMORY DEVICE

(71) Applicant: KABUSHIKI KAISHA TOSHIBA, Minato-ku (JP)

(72) Inventors: Masumi Saitoh, Yokkaichi (JP); Takayuki Ishikawa, Yokkaichi (JP); Shosuke Fujii, Kuwana (JP); Hidenori Miyagawa, Yokkaichi (JP); Chika Tanaka, Yokohama (JP); Ichiro Mizushima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/921,848

(22) Filed: Oct. 23, 2015

(65) Prior Publication Data

US 2016/0043311 A1 Feb. 11, 2016

Related U.S. Application Data

(62) Division of application No. 14/446,419, filed on Jul. 30, 2014, now Pat. No. 9,202,845.

(30) Foreign Application Priority Data

Sep. 17, 2013 (JP) .................. 2013-192386

(51) Int. Cl.
*H01L 45/00* (2006.01)
*H01L 27/24* (2006.01)

(52) U.S. Cl.
CPC .......... *H01L 45/085* (2013.01); *H01L 27/2436* (2013.01); *H01L 27/2481* (2013.01); *H01L 45/12* (2013.01); *H01L 45/1233* (2013.01); *H01L 45/1266* (2013.01); *H01L 45/148* (2013.01); *H01L 45/1616* (2013.01); *H01L 45/1641* (2013.01)

(58) Field of Classification Search
CPC ... H04L 45/085; H04L 45/12; H04L 45/1233; H04L 45/1266; H04L 45/148; H04L 45/1616; H04L 45/1641; H04L 27/2436; H04L 27/2481
See application file for complete search history.

(56) References Cited

U.S. PATENT DOCUMENTS 6,497,988 B2 12/2002 Tyan et al.
7,233,017 B2 6/2007 Yoon et al.
(Continued)

FOREIGN PATENT DOCUMENTS

JP 2012-084774 4/2012
JP 2013-201271 10/2013

*Primary Examiner* — Ida M Soward
(74) *Attorney, Agent, or Firm* — Oblon, McClelland, Maier & Neustadt, L.L.P

(57) ABSTRACT

According to one embodiment, a memory device includes a first electrode, a second electrode and a variable resistance layer. The second electrode includes a metal. The metal is more easily ionizable than a material of the first electrode. The variable resistance layer is disposed between the first electrode and the second electrode. The variable resistance layer includes a first layer and a second layer. The first layer has a relatively high crystallization rate. The second layer contacts the first layer. The second layer has a relatively low crystallization rate. The first layer and the second layer are stacked along a direction connecting the first electrode and the second electrode.

12 Claims, 17 Drawing Sheets

(56) References Cited

U.S. PATENT DOCUMENTS

| | | |
|---|---|---|
| 7,431,973 B2 | 10/2008 | Kitaura et al. |
| 7,897,953 B2 | 3/2011 | Liu |
| 8,084,113 B2 | 12/2011 | Sekiguchi et al. |
| 8,450,711 B2 | 5/2013 | Williams et al. |
| 8,481,990 B2 | 7/2013 | Kawashima et al. |
| 8,742,391 B2 | 6/2014 | Mizushima et al. |
| 8,766,233 B2 | 7/2014 | Sakotsubo et al. |
| 8,779,406 B2 | 7/2014 | Ito et al. |
| 8,792,268 B2 | 7/2014 | Katoh |
| 9,082,973 B2 * | 7/2015 | Ishikawa ............... H01L 45/148 |
| 2006/0146685 A1 | 7/2006 | Nagata et al. |
| 2006/0233998 A1 | 10/2006 | Takada et al. |
| 2009/0020745 A1 * | 1/2009 | Jeong ................... G11C 13/003 257/4 |
| 2012/0205608 A1 | 8/2012 | Yamauchi et al. |
| 2012/0211719 A1 * | 8/2012 | Haimoto ............... H01L 45/085 257/4 |
| 2012/0267598 A1 | 10/2012 | Sakotsubo et al. |
| 2013/0107606 A1 | 5/2013 | Katoh |
| 2013/0121063 A1 | 5/2013 | Tsuji et al. |
| 2013/0240825 A1 | 9/2013 | Fujii et al. |
| 2013/0270506 A1 | 10/2013 | Mizushima et al. |
| 2013/0295745 A1 | 11/2013 | Takahashi et al. |
| 2014/0061573 A1 | 3/2014 | Mikawa et al. |
| 2014/0110659 A1 | 4/2014 | Murase et al. |

* cited by examiner

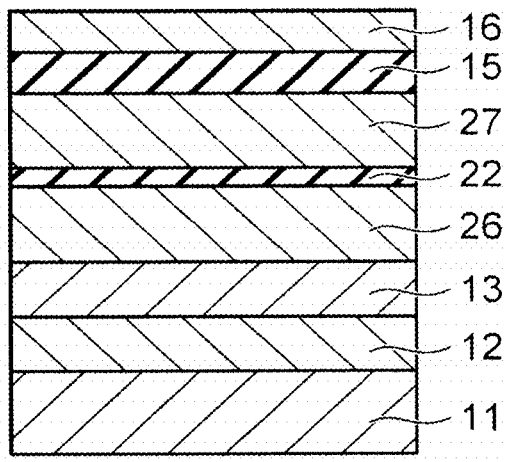
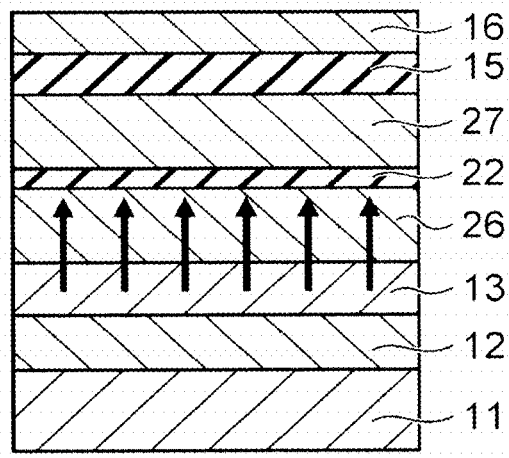

POLYCRYSTALLINE
SILICON LAYER
(RETENTION CHARACTERISTICS
: SUPERIOR)

AMORPHOUS
SILICON LAYER
(RETENTION CHARACTERISTICS
: INFERIOR)

MEMORY DEVICE

CROSS-REFERENCE TO RELATED APPLICATIONS

This application is a divisional of U.S. application Ser. No. 14/446,419 filed Jul. 30, 2014, and is based upon and claims the benefit of priority from Japanese Patent Application No.2013-192386, filed on Sep. 17, 2013; the entire contents of each of which are incorporated herein by reference.

FIELD

Embodiments described herein relate generally to a memory device.

BACKGROUND

Two-terminal resistance random access memory is actively being developed as large-capacity nonvolatile memory to replace conventional floating-gate type NAND flash memory. Low voltage/low current operations, high speed switching, and downscaling/higher integration of the memory cells are possible for this type of memory. Various materials are being proposed for the variable resistance layer of resistance random access memory, among which ionic memory is promising because ionic memory includes a silicon layer or a silicon oxide layer, which are compatible with existing LSI processes, as the variable resistance layer. Ionic memory includes silver (Ag) as the ion source electrode. Ionic memory has the advantages such as and low current operations, and rectifying operations. In ionic memory, the on/off operations of the memory cell are realized by causing a filament of silver to precipitate in and disappear from the variable resistance layer.

Generally, a trade-off relationship exists between the data retention characteristics and the ease of resetting data for nonvolatile memory. For ionic memory as well, in the case of a variable resistance layer configured to have good retention characteristics, the filament that is formed inside the variable resistance layer in the set state is stable; and therefore, a high voltage must be applied to perform the reset operation, that is, to cause the filament to disappear. The memory operations are harmed by applying the high voltage because the rewriting durability degrades.

BRIEF DESCRIPTION OF THE DRAWINGS

FIGS. 6A and 6B are cross-sectional views showing a method for manufacturing the memory device according to the second embodiment;

DETAILED DESCRIPTION

In general, according to one embodiment, a memory device includes a first electrode, a second electrode and a variable resistance layer. The second electrode includes a metal. The metal is more easily ionizable than a material of the first electrode. The variable resistance layer is disposed between the first electrode and the second electrode. The variable resistance layer includes a first layer and a second layer. The first layer has a relatively high crystallization rate. The second layer contacts the first layer. The second layer has a relatively low crystallization rate. The first layer and the second layer are stacked along a direction connecting the first electrode and the second electrode.

Embodiments of the invention will now be described with reference to the drawings.

(First Embodiment)

Figure 1:
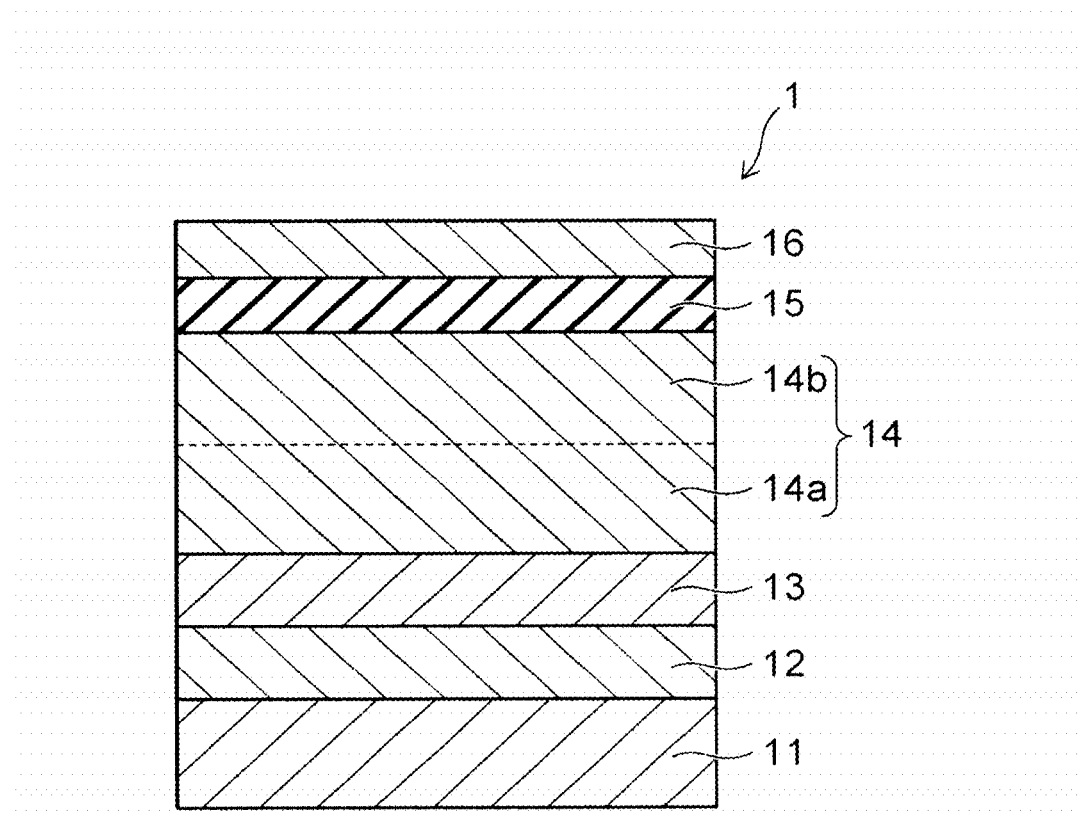
FIG. 1 is a cross-sectional view showing a memory device according to a first embodiment.

FIG. 1 is a cross-sectional view showing a memory device according to the embodiment.

As shown in FIG. 1, an opposing electrode 11, a current-limiting layer 12, a crystallization-inducing metal layer 13, a variable resistance layer 14, a diffusion prevention layer 15, and an ion source electrode 16 are stacked in this order in the memory device 1 according to the embodiment. The crystallization rate of a lower portion 14a of the variable resistance layer 14 is higher than the crystallization rate of an upper portion 14b of the variable resistance layer 14. In the embodiment, the lower portion 14a and the upper portion 14b of the variable resistance layer 14 are formed as one body. Therefore, the boundary between the lower portion 14a and the upper portion 14b does not always appear to be distinct.

In the specification, the "crystallization rate" refers to the proportion of the entire surface area that is a crystal when the layer of interest is observed. The crystallization rate is measurable by, for example, cross section TEM microscopy, electron diffraction, etc. The crystallization rate of the lower portion 14a is, for example, at least 10% higher than the crystallization rate of the upper portion 14b. For example, the lower portion 14a is formed of a polycrystalline body; and the upper portion 14b is formed of an amorphous body.

The opposing electrode 11 is, for example, a conductive layer made of tungsten (W), titanium (Ti), tantalum (Ta), platinum (Pt), or a nitride of these metals, or a multilayered film in which such a conductive layer is multiply stacked. The current-limiting layer 12 is formed of, for example, a high resistance metal such as tantalum silicon nitride (TaSiN), etc. The crystallization-inducing metal layer 13 is a layer that induces the crystallization of the variable resistance layer 14 and is formed of, for example, nickel (Ni). The crystallization-inducing metal layer 13 may be formed of aluminum (Al) or palladium (Pd).

The variable resistance layer 14 is formed of, for example, silicon (Si). The variable resistance layer 14 may be formed of silicon-germanium (SiGe), germanium (Ge), or a compound semiconductor. The thickness of the variable resistance layer 14 is, for example, 2 to 50 nm. The diffusion prevention layer 15 is a layer that suppresses the diffusion of the metal of the ion source electrode 16 into the variable resistance layer 14, is formed of, for example, an oxide of the material of the variable resistance layer 14, and is formed of, for example, silicon oxide (SiO). The thickness of the diffusion prevention layer 15 is, for example, 1 to 5 nm.

The ion source electrode 16 is formed of a metal that is more easily ionizable than the material of the opposing electrode 11, the material of the current-limiting layer 12, and the material of the crystallization-inducing metal layer 13 and is formed of, for example, silver (Ag). According to the material of the opposing electrode 11, the material of the current-limiting layer 12, and the material of the crystallization-inducing metal layer 13, the ion source electrode 16 may be formed of, for example, nickel (Ni), cobalt (Co), aluminum (Al), or copper (Cu). In the embodiment, for example, the crystallization-inducing metal layer 13 is formed of nickel; the variable resistance layer 14 is formed of silicon; the diffusion prevention layer 15 is formed of silicon oxide; and the ion source electrode 16 is formed of silver.

In the memory device 1, one memory cell includes a stacked body made of the opposing electrode 11, the current-limiting layer 12, the crystallization-inducing metal layer 13, the variable resistance layer 14, the diffusion prevention layer 15, and the ion source electrode 16.

A method for manufacturing the memory device according to the embodiment will now be described.

Figure 2A:
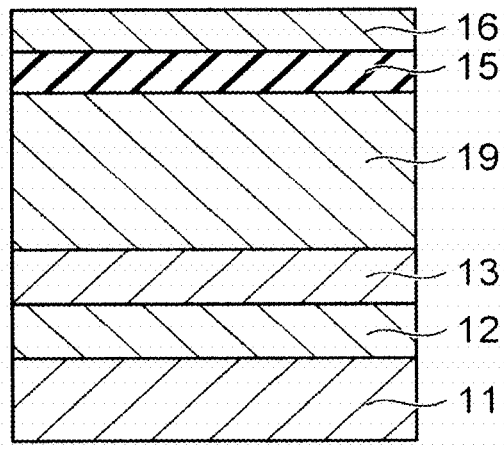
FIGS. 2A and 2B are cross-sectional views showing a method for manufacturing the memory device according to the first embodiment.
Figure 2B:
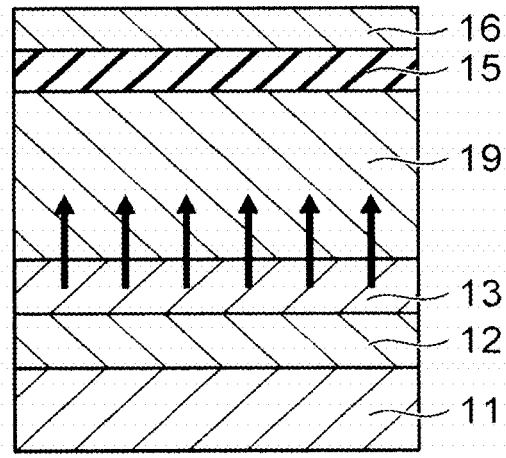

FIGS. 2A and 2B are cross-sectional views showing the method for manufacturing the memory device according to the embodiment.

First, as shown in FIG. 2A, a stacked body is formed in which the opposing electrode 11, the current-limiting layer 12, the crystallization-inducing metal layer 13, an amorphous silicon layer 19, the diffusion prevention layer 15, and the ion source electrode 16 are stacked in this order.

Then, as shown in FIG. 2B, heat treatment of the stacked body is performed. At this time, because the nickel included in the crystallization-inducing metal layer 13 is used as the seed of the crystallization of the amorphous silicon layer 19, the amorphous silicon layer 19 crystallizes from the lower surface toward the upper surface. This method is called metal-induced crystallization. The arrows of FIG. 2B illustrate the direction in which the crystallization progresses. This is similar for other drawings described below.

By appropriately controlling the time and temperature of the heat treatment, the crystallization rate of the lower portion of the amorphous silicon layer 19 can be set to be higher than the crystallization rate of the upper portion of the amorphous silicon layer 19, e.g., the crystallization rate of the lower portion can be set to be at least 10% higher than the crystallization rate of the upper portion. For example, only the lower portion of the amorphous silicon layer 19 may be crystallized; and the amorphous upper portion of the amorphous silicon layer 19 may be maintained as-is. Thereby, the amorphous silicon layer 19 is used as the variable resistance layer 14 described above.

Hereinbelow, the case where the thickness of the amorphous silicon layer 19 is 10 nm is described as an example of the relationship between the temperature and time of the heat treatment process recited above.

Figure 3:
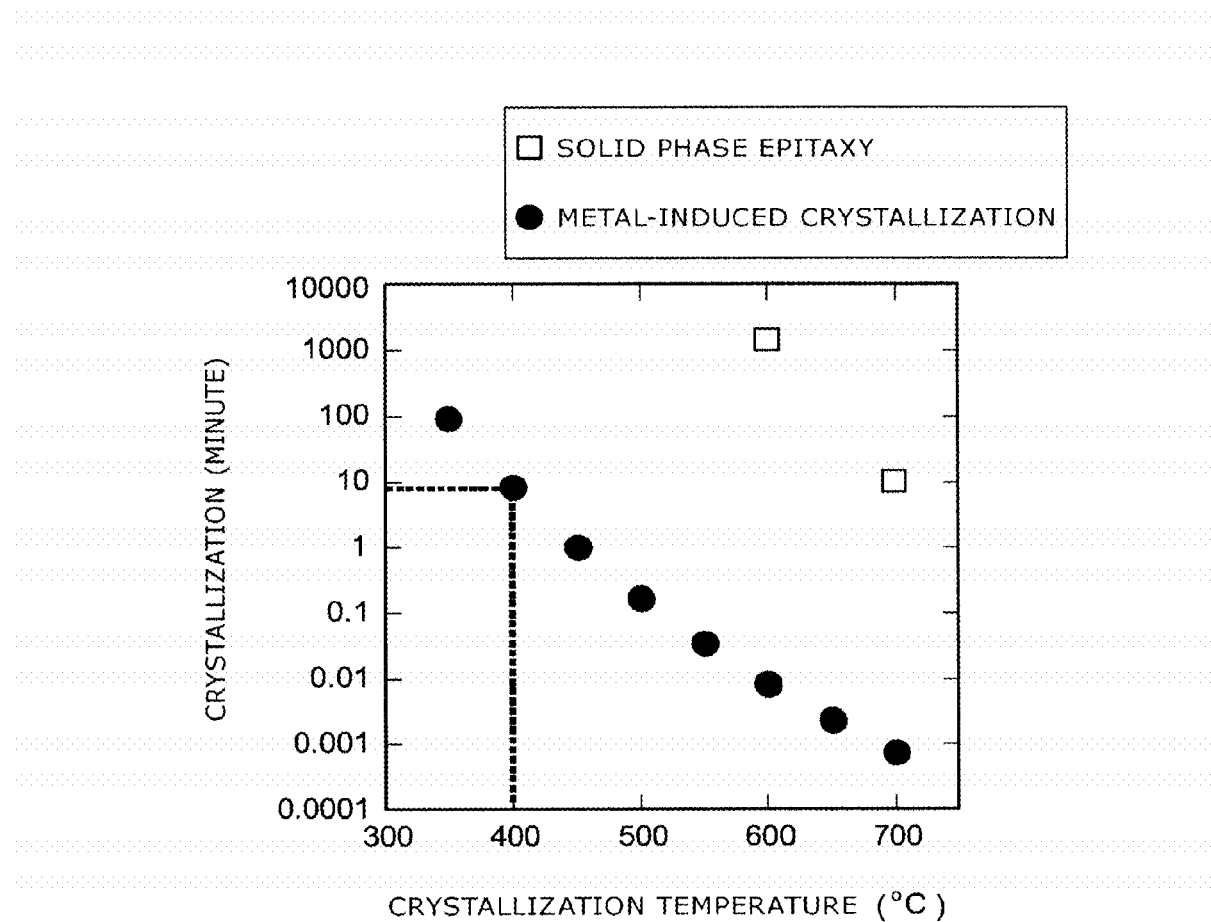
FIG. 3 is a graph showing conditions at which an amorphous silicon layer having a thickness of 5 nm crystallizes, where the horizontal axis is a heating temperature, the vertical axis is a heating time.

FIG. 3 is a graph showing the conditions at which an amorphous silicon layer having a thickness of 5 nm crystallizes, where the horizontal axis is the heating temperature, the vertical axis is the heating time, the black circle plots (●) illustrate the case where metal-induced crystallization is used, and the white rectangle plots (□) illustrate the case where solid phase epitaxy is used.

As shown in FIG. 3, in solid phase epitaxy, a typical crystallization temperature is high, i.e., 600 to 700° C. On the other hand, in metal-induced crystallization, the crystallization temperature for a crystallization time on the order of minutes can be as low as 350° C. to 400° C. For example, an amorphous silicon layer having a thickness of 5 nm can be crystallized by heat treatment in which heating is performed for 10 minutes at a temperature of 400° C.

Operations of the memory device according to the embodiment will now be described.

FIGS. 4A to 4F are schematic cross-sectional views showing the operations of the memory device according to the embodiment.

Figure 4:
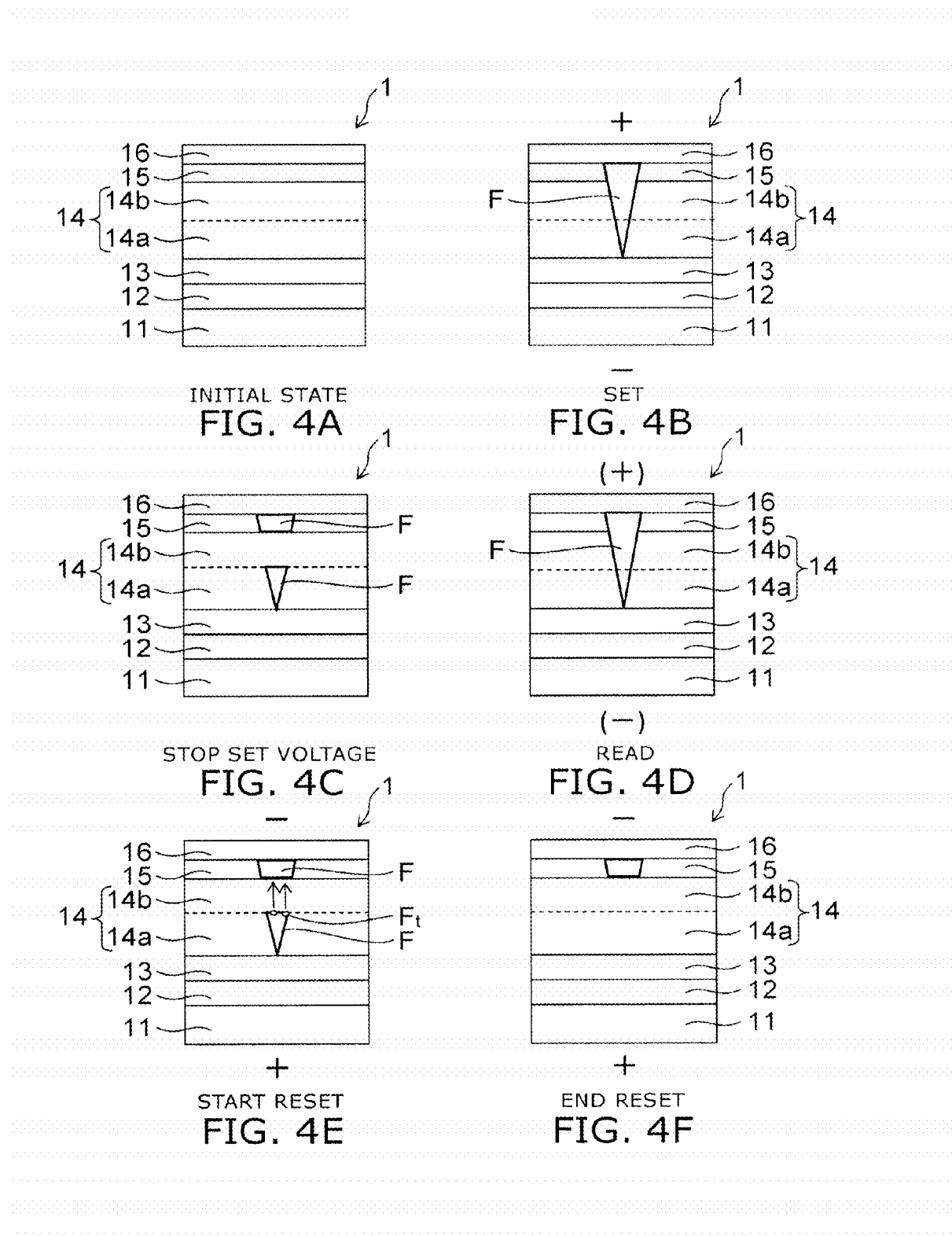
FIGS. 4A to 4F are schematic cross-sectional views showing an operations of the memory device according to the first embodiment.

As shown in FIG. 4A, a filament is not formed inside the variable resistance layer 14 and inside the diffusion prevention layer 15 in the memory cell in the initial state. At this time, the variable resistance layer 14 is in a high resistance state (an off-state).

Then, in the memory cell as shown in FIG. 4B, when a prescribed set voltage is applied to cause the opposing electrode 11 to be negative and the ion source electrode 16 to be positive, the silver atoms that are included in the ion source electrode 16 are ionized, penetrate into the diffusion prevention layer 15 and into the variable resistance layer 14, and precipitate by combining with electrons supplied from the opposing electrode 11. Thereby, a filament F that is made of silver is formed inside the diffusion prevention layer 15 and inside the variable resistance layer 14. As a result, the variable resistance layer 14 is switched to a low resistance state (an on-state). This operation is called "set."

Continuing as shown in FIG. 4C, when the set voltage is stopped and a constant amount of time has elapsed, the filament F formed inside the variable resistance layer 14 has a portion that disappears from the upper portion 14b which has a relatively low crystallinity and a portion that remains inside the lower portion 14a which has a relatively high crystallinity. It is considered that this is because, in the case where the crystallization rate of the main material is high, the silicon inside the crystal regions (grains) forms dense bonds; the filament is formed concentratively in the boundary regions between the grains; the filament that is formed in such limited regions has a high density and is tough; and therefore, the filament is stable and does not disappear easily even after time has elapsed.

As shown in FIG. 4D, when a read-out voltage that is lower than the set voltage is applied to the memory cell in the low resistance state to cause the opposing electrode 11 to be negative and the ion source electrode 16 to be positive, the filament F is reproduced inside the upper portion 14b of the variable resistance layer 14 by using the filament F remaining inside the lower portion 14a of the variable resistance layer 14 as a starting point; and a read-out current that corresponds to the low resistance state flows inside the variable resistance layer 14.

On the other hand, as shown in FIG. 4E, when a prescribed reset voltage is applied to the memory cell in the low resistance state to cause the opposing electrode 11 to be positive and the ion source electrode 16 to be negative, an electric field is applied concentratively to a tip portion Ft of the filament F, i.e., the end portion on the ion source electrode 16 side, that remains inside the lower portion 14a of the variable resistance layer 14. Therefore, the silver atoms of the tip portion Ft are ionized and move toward the ion source electrode 16. As a result, the filament F at this portion disappears; the tip portion Ft recedes slightly toward the opposing electrode 11 side; and the electric field is applied concentratively to the tip portion Ft that has receded. Thus, the tip portion Ft of the filament F continues to recede toward the opposing electrode 11. Thereby, the filament F that is inside the lower portion 14a disappears progressively from the end portion on the ion source electrode 16 side.

As a result, as shown in FIG. 4F, the filament F finally disappears from the variable resistance layer 14; and the variable resistance layer 14 is switched to the high resistance state (the off-state). This operation is called "reset." Even when the read-out voltage is applied in this state, the filament F substantially is not reproduced; and only a read-out current that corresponds to the high resistance state flows inside the variable resistance layer 14.

Then, when the set voltage is applied to the memory cell in the high resistance state, the variable resistance layer 14 is set again, transitions to the low resistance state shown in FIG. 4B, and subsequently stabilizes in the state shown in FIG. 4C. Thus, the state of the memory cell can be arbitrarily set to the low resistance state or the high resistance state by repeating set and reset.

Effects of the embodiment will now be described.

In the embodiment, after the variable resistance layer 14 is set, even when the set voltage is stopped, the filament remains inside the lower portion 14a of the variable resistance layer 14 as shown in FIG. 4C. Because the crystallinity of the lower portion 14a is high, the filament F that is formed inside the lower portion 14a is stable for, for example, 10 years or more. Therefore, the data retention characteristics of the memory device 1 are good.

Also, as shown in FIG. 4E, when the reset voltage is applied to the variable resistance layer 14 in the low resistance state, the filament F has disappeared inside the upper portion 14b; therefore, the electric field concentrates in the tip portion Ft of the filament F remaining inside the lower portion 14a; and the filament F disappears efficiently. Therefore, the reset of the memory device 1 is easy.

Thus, because the filament F that is formed inside the lower portion 14a is exceedingly stable over time, excellent data retention characteristics are realized. On the other hand, because the filament F that is formed inside the upper portion 14b disappears quickly, the tip portion Ft is formed in the filament F that is inside the lower portion 14a; and the responsiveness to the reset voltage is high because the electric field concentrates in the tip portion Ft.

The thickness of the variable resistance layer 14 is thin because the variable resistance layer 14 is a single silicon layer. Therefore, the set voltage can be low. Also, the patterning of the variable resistance layer 14 is easy. Although it is favorable for the thicknesses of the variable resistance layer 14 and the diffusion prevention layer 15 to be thin to reduce the set voltage, it is favorable for the thicknesses to be thick to reduce the leakage current and the fluctuation of the thicknesses. To balance such characteristics, it is favorable for the thickness of the variable resistance layer 14 to be about 2 to 50 nm; and it is favorable for the thickness of the diffusion prevention layer 15 to be about 1 to 5 nm.

In the embodiment, because the lower portion 14a of the variable resistance layer 14 can be crystallized at a low temperature of, for example, 350 to 400° C., the metal members, i.e., the opposing electrode 11, the crystallization-inducing metal layer 13, and the ion source electrode 16, do not degrade even when performing the heat treatment for crystallization after stacking the layers from the opposing electrode 11 to the ion source electrode 16. In particular, in the case where the ion source electrode 16 is formed of silver, it is highly advantageous to be able to implement the crystallization heat treatment at a low temperature because silver diffuses easily.

Thus, according to the embodiment, an ionic memory-type memory device having both good retention characteristics and reset characteristics can be realized without increasing the set voltage.

Conversely, in the case where the entire variable resistance layer 14 is formed of polycrystalline silicon, the data retention characteristics are good because the entire filament is exceedingly stable; but resetting is difficult.

Also, in the case where the entire variable resistance layer 14 is formed of amorphous silicon, resetting is easy because the filament is unstable; but the data retention characteristics are poor.

Although it may be considered to form the variable resistance layer 14 as a stacked body including a layer in which a stable filament forms and a layer in which an unstable filament forms, the variable resistance layer 14 is undesirably thick in such a case; and a high set voltage is necessary. Further, the manufacturing cost increases because the number of manufacturing processes increases and the patterning of the variable resistance layer 14 is difficult.

Although an example is illustrated in the embodiment in which the crystallization rate of the lower portion 14a of the variable resistance layer 14 is relatively high and the crystallization rate of the upper portion 14b of the variable resistance layer 14 is relatively low, this may be reversed. In other words, the crystallization rate of the lower portion 14a may be relatively low; and the crystallization rate of the upper portion 14b may be relatively high. In such a case as well, effects similar to the effects described above are obtained.

It is sufficient for at least one high crystallization-rate layer having a relatively high crystallization rate and at least one low crystallization-rate layer having a relatively low crystallization rate to be provided in the variable resistance layer 14 and for these layers to be stacked along the direction connecting the opposing electrode 11 and the ion source electrode 16. Thereby, when the set voltage is applied, the filament is formed to pierce both the high crystallization-rate layer and the low crystallization-rate layer; and when the set voltage is stopped, the filament disappears inside the low crystallization-rate layer while the filament remains inside the high crystallization-rate layer to guarantee the retention characteristics. Then, when the reset voltage is applied, the electric field concentrates at the end portion of the filament on the low crystallization-rate layer side inside the high crystallization-rate layer; and the filament disappears efficiently from this end portion side. Therefore, the reset voltage can be set to be low.

(Second Embodiment)

The embodiment differs from the first embodiment described above in that an interface oxide layer is included inside the variable resistance layer. Otherwise, the embodiment is similar to the first embodiment; and a description of the common portions is omitted.

Figure 5:
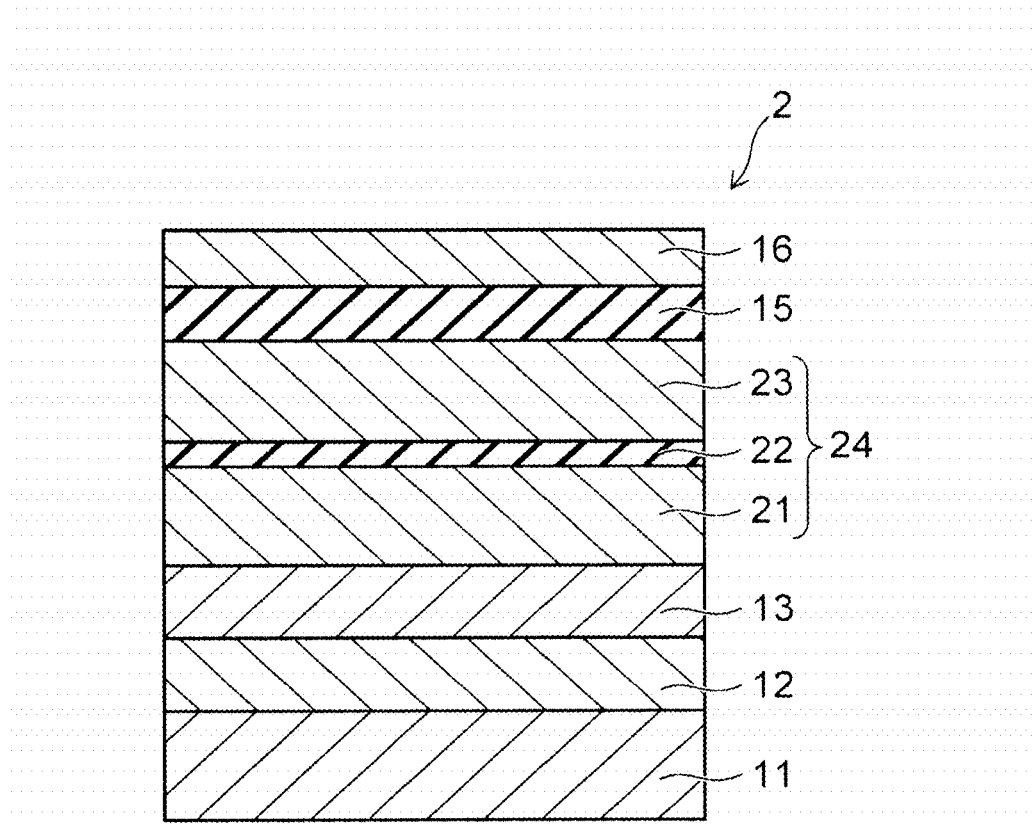
FIG. 5 is a cross-sectional view showing a memory device according to a second embodiment.

FIG. 5 is a cross-sectional view showing the memory device according to the embodiment.

In the memory device 2 according to the embodiment as shown in FIG. 5, the opposing electrode 11, the current-limiting layer 12, the crystallization-inducing metal layer 13, a silicon layer 21, an interface oxide layer 22, a silicon layer 23, the diffusion prevention layer 15, and the ion source electrode 16 are stacked in this order. The crystallization rate of the silicon layer 21 is higher than the crystallization rate of the silicon layer 23, e.g., at least 10% higher. For example, the silicon layer 21 is made of polycrystalline silicon; and the silicon layer 23 is made of amorphous silicon. A variable resistance layer 24 is formed of the silicon layer 21, the interface oxide layer 22, and the silicon layer 23. The thicknesses of the silicon layer 21 and the silicon layer 23 are, for example, about 1 to 25 nm. It is desirable for the thickness of the interface oxide layer 22 to be, for example, about 0.1 to 2 nm because the set voltage may increase if the interface oxide layer 22 is too thick.

A method for manufacturing the memory device according to the embodiment will now be described.

FIGS. 6A and 6B are cross-sectional views showing the method for manufacturing the memory device according to the embodiment.

First, as shown in FIG. 6A, a stacked body is formed in which the opposing electrode 11, the current-limiting layer 12, the crystallization-inducing metal layer 13, an amorphous silicon layer 26, the interface oxide layer 22, an amorphous silicon layer 27, the diffusion prevention layer 15, and the ion source electrode 16 are stacked in this order. At this time, the amorphous silicon layer 26, the interface oxide layer 22, and the amorphous silicon layer 27 may be formed continuously by, for example, LPCVD (low pressure chemical vapor deposition) using monosilane gas. Specifically, it is sufficient to supply only monosilane gas when forming the amorphous silicon layer 26, supply an oxidizing agent in addition to monosilane gas when forming the interface oxide layer 22, and supply only monosilane gas again when forming the amorphous silicon layer 27.

Then, as shown in FIG. 6B, heat treatment of the stacked body is performed. Thereby, the amorphous silicon layer 26 crystallizes from the lower surface toward the upper surface because the nickel included in the crystallization-inducing metal layer 13 induces crystallization of the amorphous silicon layer 26. However, the crystallization of the amorphous silicon layer 27 is suppressed because the interface oxide layer 22 impedes the crystallization from the amorphous silicon layer 26. Thereby, the amorphous silicon layer 26 is used as the silicon layer 21 having a relatively high crystallization rate; and the amorphous silicon layer 27 is used as the silicon layer 23 having a relatively low crystallization rate. Thus, the memory device 2 according to the embodiment is manufactured.

Effects of the embodiment will now be described.

According to the embodiment, similarly to the first embodiment described above, the trade-off between the memory retention characteristics and the memory reset characteristics can be eliminated. Also, in the embodiment, because the interface oxide layer 22 is formed between the amorphous silicon layer 26 and the amorphous silicon layer 27, the progression of the crystallization from the amorphous silicon layer 26 toward the amorphous silicon layer 27 can be impeded; and a large difference between the crystallization rate of the silicon layer 21 and the crystallization rate of the silicon layer 23 can be provided easily.

According to the embodiment, because the amorphous silicon layer 26, the interface oxide layer 22, and the amorphous silicon layer 27 can be formed continuously by the same LPCVD process, there is substantially no increase of the manufacturing cost due to the interface oxide layer 22 being provided. Although the variable resistance layer 24 of the embodiment is thicker than the variable resistance layer 14 of the first embodiment (referring to FIG. 1) by the thickness of the interface oxide layer 22, the increase of the set voltage can be suppressed by making the diffusion prevention layer 15 thin. Otherwise, the configuration, the manufacturing method, the operations, and the effects of the embodiment are similar to those of the first embodiment described above.

(Third Embodiment)

The embodiment differs from the first embodiment described above in that the concentration of oxygen (O), the concentration of nitrogen (N), or the total concentration of oxygen and nitrogen is higher in the upper portion of the variable resistance layer than in the lower portion of the variable resistance layer. Otherwise, the embodiment is similar to the first embodiment; and a description of the common portions is omitted.

Figure 7:
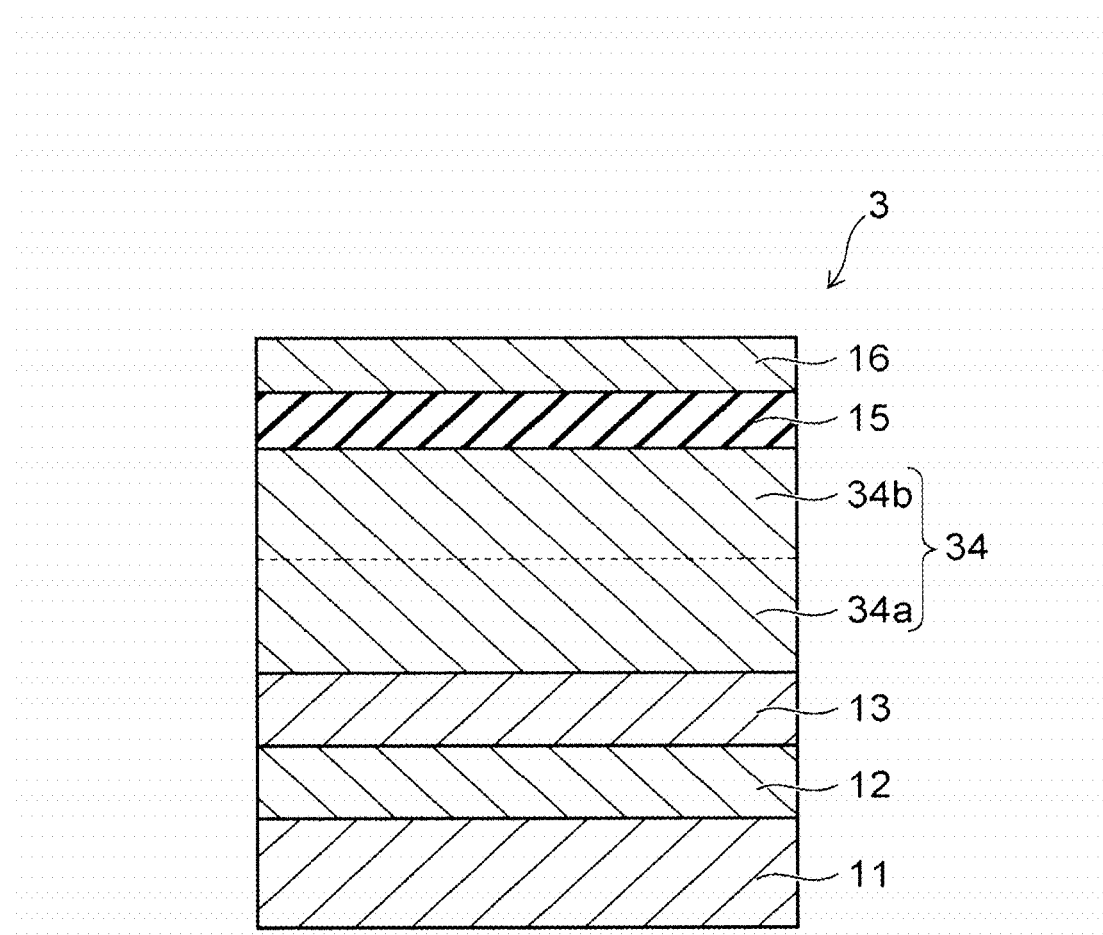
FIG. 7 is a cross-sectional view showing a memory device according to a third embodiment.

FIG. 7 is a cross-sectional view showing the memory device according to the embodiment.

As shown in FIG. 7, the memory device 3 according to the embodiment differs from the memory device 1 (referring to FIG. 1) according to the first embodiment described above in that a variable resistance layer 34 is provided instead of the variable resistance layer 14. The variable resistance layer 34 is formed as, for example, one body of silicon. The oxygen concentration, the nitrogen concentration, or the total concentration of oxygen and nitrogen in an upper portion 34b of the variable resistance layer 34 is higher than that of a lower portion 34a of the variable resistance layer 34. For example, the oxygen concentration, the nitrogen concentration, or the total concentration of oxygen and nitrogen in the upper portion 34b is higher than $1 \times 10^{20}$ cm$^{-3}$; and the oxygen concentration, the nitrogen concentration, or the total concentration of oxygen and nitrogen in the lower portion 34a is lower than $1 \times 10^{20}$ cm$^{-3}$. The crystallization rate of the lower portion 34a is higher than the crystallization rate of the upper portion 34b, e.g., at least 10% higher.

A method for manufacturing the memory device according to the embodiment will now be described.

Figure 8A:
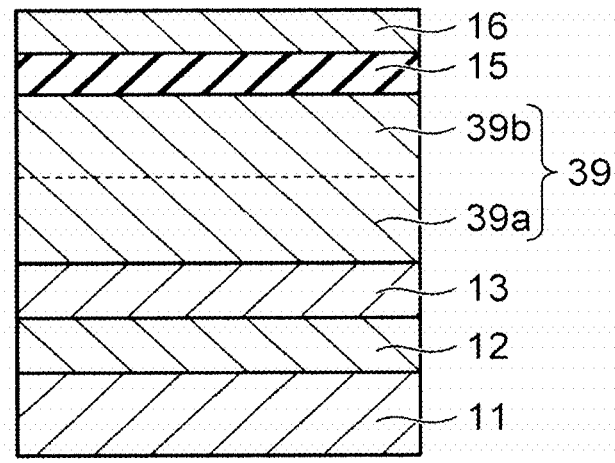
FIGS. 8A and 8B are cross-sectional views showing a method for manufacturing the memory device according to the third embodiment.
Figure 8B:
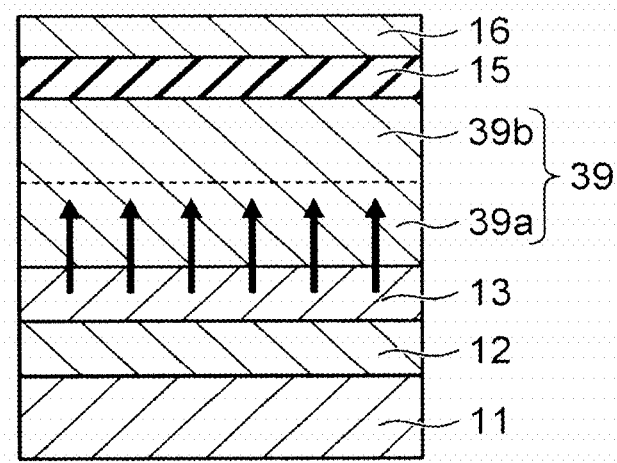

FIGS. 8A and 8B are cross-sectional views showing the method for manufacturing the memory device according to the embodiment.

First, as shown in FIG. 8A, a stacked body is formed in which the opposing electrode 11, the current-limiting layer 12, the crystallization-inducing metal layer 13, an amorphous silicon layer 39, the diffusion prevention layer 15, and the ion source electrode 16 are stacked in this order. At this time, for example, although the amorphous silicon layer 39 is formed by LPCVD using monosilane gas as the source material, a lower portion 39a that is made of amorphous silicon substantially not including oxygen and nitrogen is formed by supplying only monosilane gas for the former half of the film formation; and for the latter half of the film formation, an upper portion 39b that is made of amorphous silicon including oxygen and nitrogen is formed by supplying N$_2$O gas in addition to monosilane gas.

Then, as shown in FIG. 8B, heat treatment of the stacked body is performed. At this time, although the crystallization of the amorphous silicon layer 39 progresses from the lower surface toward the upper surface by being induced by the crystallization-inducing metal layer 13, the crystallization speed is greatly reduced at the upper portion 39b of the amorphous silicon layer 39 because the oxygen and the nitrogen suppress the crystallization of the silicon. As a result, in the variable resistance layer 34, the crystallization rate of the upper portion 34b can be maintained to be lower than the crystallization rate of the lower portion 34a. Thus, the memory device 3 according to the embodiment is manufactured.

Effects of the embodiment will now be described.

In the embodiment, compared to the first embodiment, it is easier to set the crystallization rate to be different between the lower portion 34a and the upper portion 34b of the variable resistance layer 34 because oxygen and nitrogen are introduced to only the upper portion 39b of the amorphous silicon layer 39. Also, compared to the second embodiment, the increase of the set voltage can be avoided reliably because it is unnecessary to form the oxide layer inside the variable resistance layer. Otherwise, the configuration, the manufacturing method, the operations, and the effects of the embodiment are similar to those of the first embodiment described above.

The crystallization-inducing metal layer 13 may not be provided in the embodiment. In such a case as well, the crystallization rate of the lower portion 34a of the variable resistance layer 34 can be set to be higher than the crystallization rate of the upper portion 34b by providing the concentration difference between the nitrogen and the oxygen. In the case where the crystallization-inducing metal layer 13 is not provided, the crystallization rate of the lower portion 34a may be set to be lower than the crystallization rate of the upper portion 34b by introducing at least one selected from nitrogen and oxygen to the lower portion 34a of the variable resistance layer 34.

(Fourth Embodiment)

The embodiment is an example in which a transfer gate transistor is formed in addition to the memory cells of the first embodiment in the same layer as the memory cells. Otherwise, the embodiment is similar to the first embodiment; and a description of the common portions is omitted.

Figure 9:
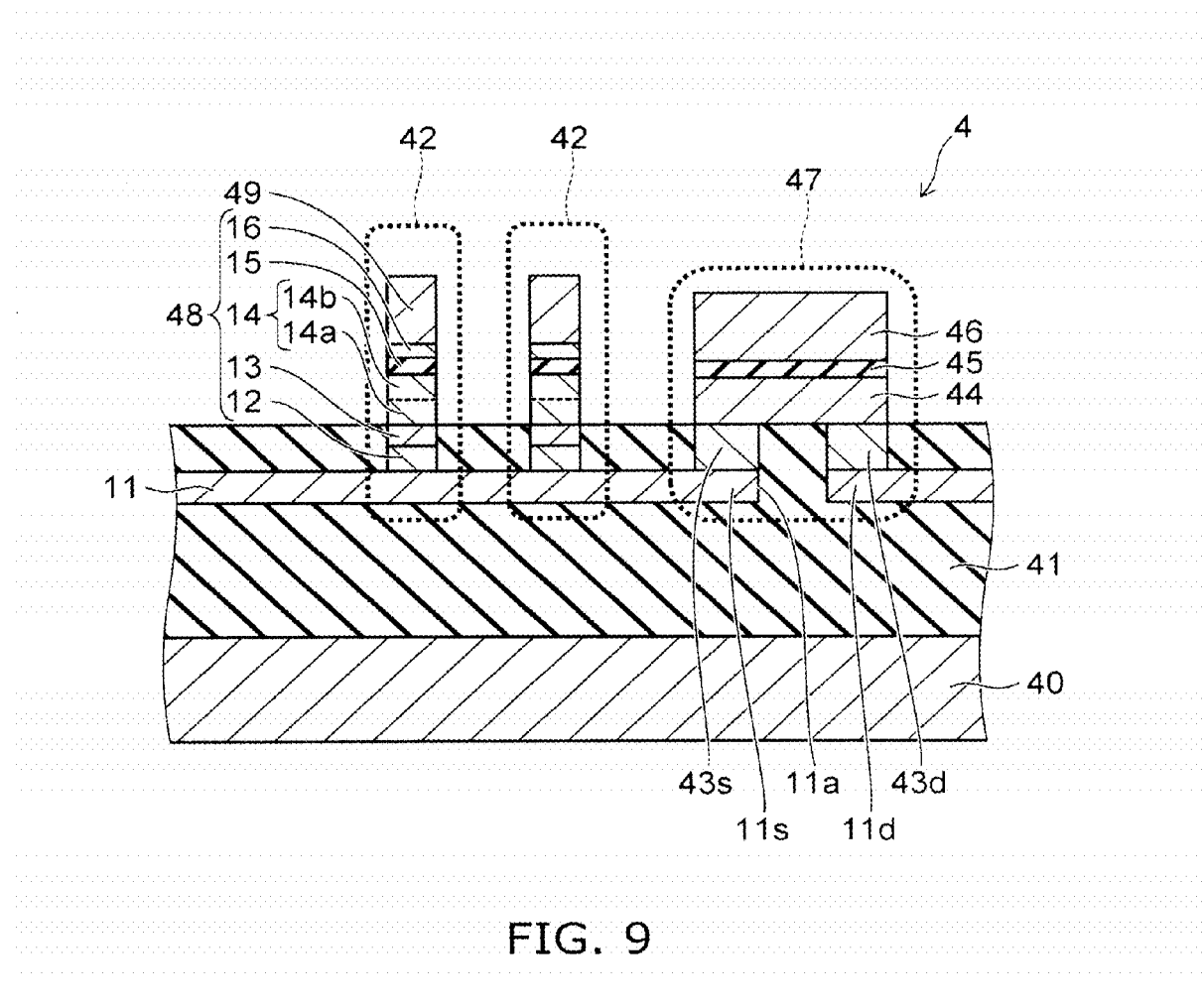
FIG. 9 is a cross-sectional view showing a memory device according to a fourth embodiment.

FIG. 9 is a cross-sectional view showing the memory device according to the embodiment.

In the memory device 4 according to the embodiment as shown in FIG. 9, a silicon substrate 40 is provided; an inter-layer insulating film 41 is provided on the silicon substrate 40; and the opposing electrode 11 having an interconnect configuration extending in one direction is provided inside the inter-layer insulating film 41. A stacked body 48 in which the current-limiting layer 12, the crystallization-inducing metal layer 13, the variable resistance layer 14, the diffusion prevention layer 15, and the ion source electrode 16 are stacked in this order is provided on the opposing electrode 11; and an interconnect 49 is provided on the stacked body 48. The interconnect 49 extends in a direction intersecting, e.g., orthogonal to, the direction in which the opposing electrode 11 extends, i.e., the direction perpendicular to the page surface of FIG. 9. A memory cell 42 includes the opposing electrode 11, the stacked body 48, and the interconnect 49. The configurations of the opposing electrode 11 and the stacked body 48 are similar to those of the memory device 1 (referring to FIG. 1) according to the first embodiment described above. In the memory device 4, multiple memory cells 42 are provided on a common opposing electrode 11.

A break 11a is made in the opposing electrode 11; and a portion of the inter-layer insulating film 41 is disposed inside the break 11a. Thereby, the opposing electrode 11 is divided by the break 11a. The pair of portions of the opposing electrode 11 opposing the break 11a on two sides of the break 11a are used as a source electrode 11s and a drain electrode 11d. In other words, the opposing electrode 11 includes two electrodes separated from each other with the break 11a interposed. A crystallization-inducing metal layer 43s is provided on the source electrode 11s; and a crystallization-inducing metal layer 43d is provided on the drain electrode 11d. A single channel layer 44 is provided on the crystallization-inducing metal layers 43s and 43d to straddle the break 11a. A gate insulator film 45 is provided on the channel layer 44; and a gate electrode 46 is provided on the gate insulator film 45. A transfer gate transistor 47 is formed of the source electrode 11s, the drain electrode 11d, the crystallization-inducing metal layers 43s and 43d, the channel layer 44, the gate insulator film 45, and the gate electrode 46.

The channel layer 44 is connected to the source electrode 11s via the crystallization-inducing metal layer 43s and connected to the drain electrode 11d via the crystallization-inducing metal layer 43d. The channel layer 44 is made of a semiconductor material, e.g., polycrystalline silicon; and the crystallization rate of the channel layer 44 is higher than the crystallization rate of the upper portion 14b of the variable resistance layer 14. The difference between the crystallization rate of the lower portion of the channel layer 44 and the crystallization rate of the upper portion of the channel layer 44 is less than 10%. The channel layer 44 contains fluorine. Therefore, the fluorine concentration of the channel layer 44 is higher than the fluorine concentration of the variable resistance layer 14.

As described below, the crystallization-inducing metal layers 43s and 43d of the transfer gate transistor 47 are formed simultaneously with the crystallization-inducing metal layers 13 of the memory cells 42; the channel layer 44 is formed simultaneously with the variable resistance layers 14; and the gate insulator film 45 is formed simultaneously with the diffusion prevention layers 15.

A method for manufacturing the memory device according to the embodiment will now be described.

FIG. 10A to FIG. 12B are cross-sectional views showing the method for manufacturing the memory device according to the embodiment.

Figure 10A:
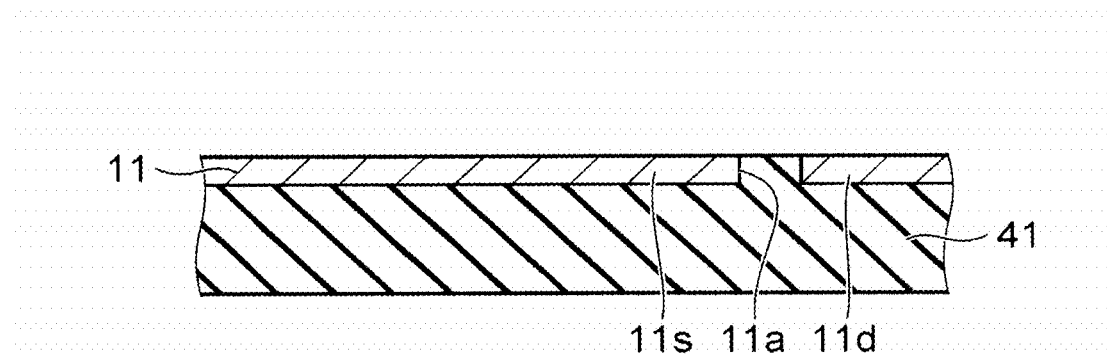
FIG. 10A to FIG. 12B are cross-sectional views showing a method for manufacturing the memory device according to the fourth embodiment.

First, as shown in FIG. 10A, the inter-layer insulating film 41 is formed on the silicon substrate 40 (referring to FIG. 9); and the opposing electrode 11 having an interconnect configuration is formed at the upper portion of the inter-layer insulating film 41. The break 11a is made in a portion of the opposing electrode 11 in the region (hereinbelow, called the "transfer gate transistor region") where the transfer gate transistor 47 is to be formed. A pair of portions of the opposing electrode 11 opposing the break 11a on two sides of the break 11a is used as the source electrode 11s and the drain electrode 11d.

Figure 10B:
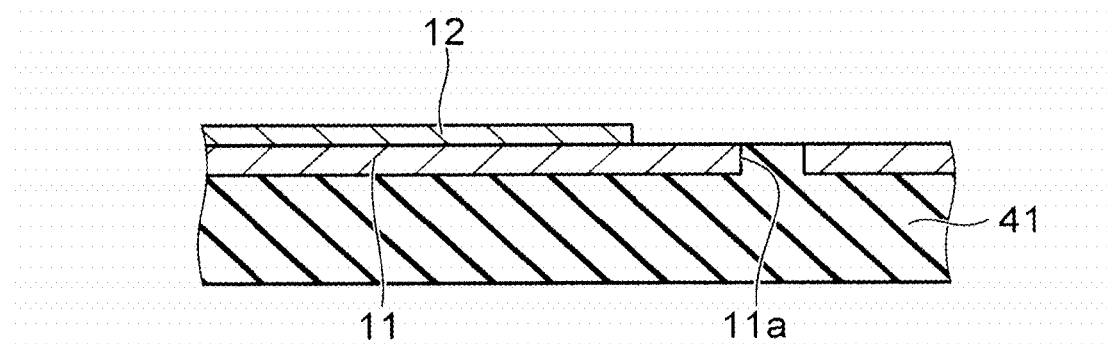

Then, as shown in FIG. 10B, the current-limiting layer 12 is formed; and the current-limiting layer 12 is removed from the transfer gate transistor region by patterning.

Figure 10C:
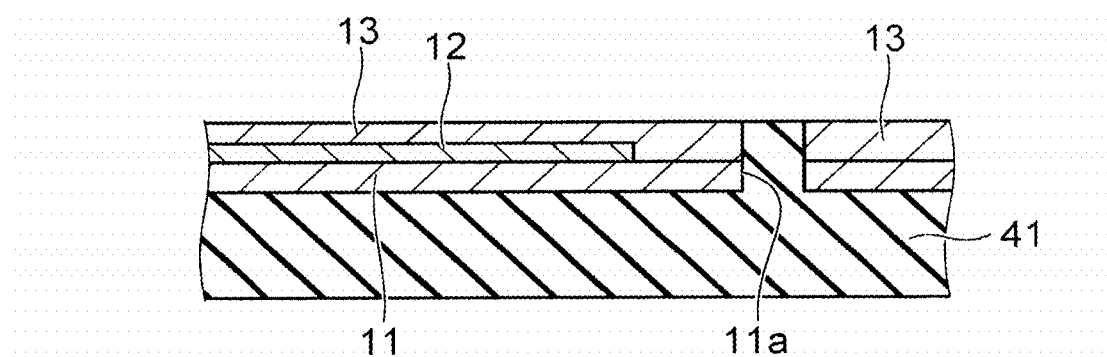

Continuing as shown in FIG. 10C, the crystallization-inducing metal layer 13 is formed; and the crystallization-inducing metal layer 13 is removed from the region directly above the break 11a by patterning. Then, the inter-layer insulating film 41 is deposited further; and the upper surface is planarized.

Figure 11A:
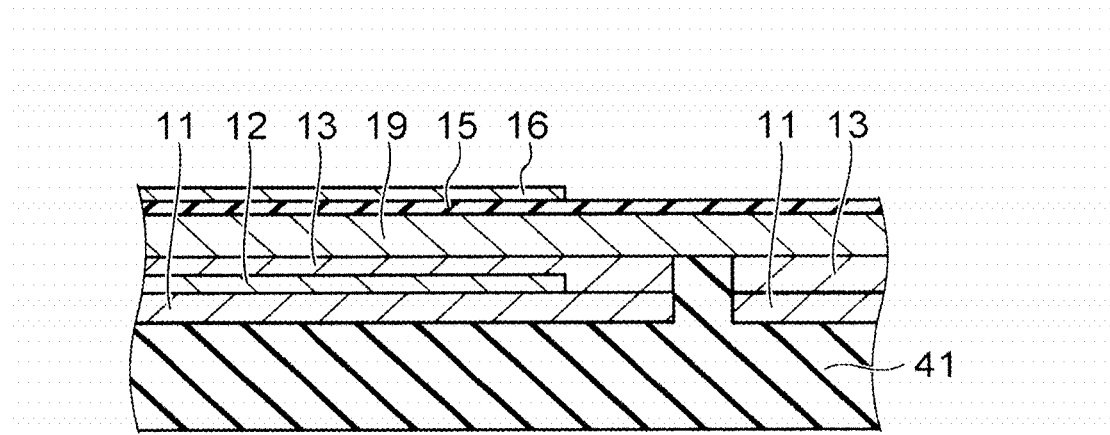

Then, as shown in FIG. 11A, the amorphous silicon layer 19, the diffusion prevention layer 15, and the ion source electrode 16 are formed in this order; and the ion source electrode 16 is removed from the transfer gate transistor region by patterning the ion source electrode 16.

Figure 11B:
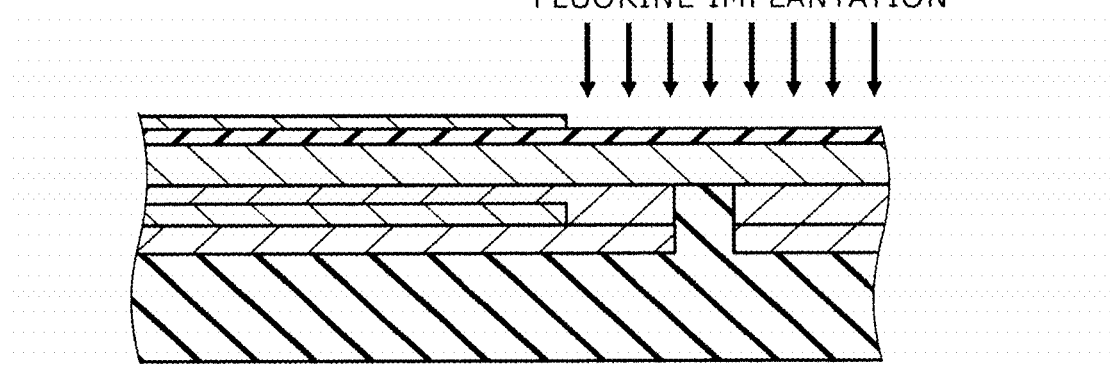

Continuing as shown in FIG. 11B, fluorine ions are implanted into only the transfer gate transistor region. Thereby, fluorine is introduced to the portion of the amorphous silicon layer 19 disposed in the transfer gate transistor region. At this time, it is desirable for the implantation amount to be, for example, not less than $10^{14}$ $cm^{-2}$.

Figure 11C:
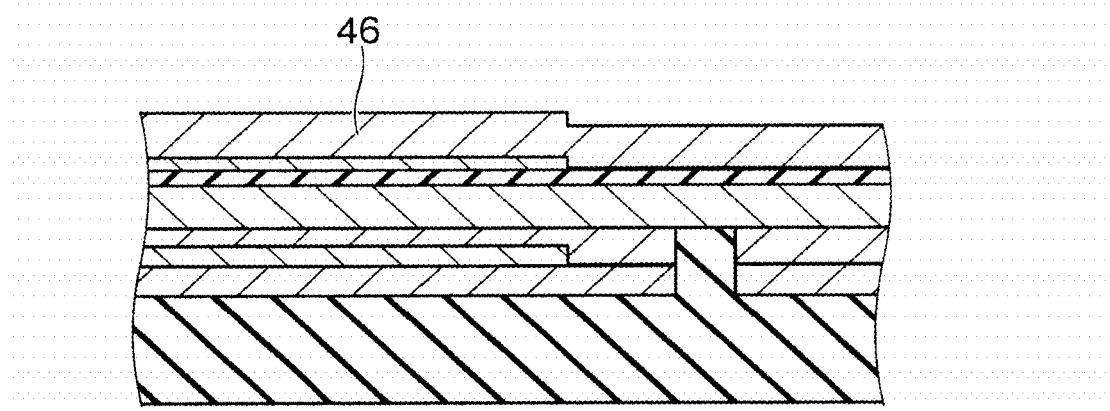

Then, the gate electrode 46 is formed on the entire surface as shown in FIG. 11C.

Figure 12A:
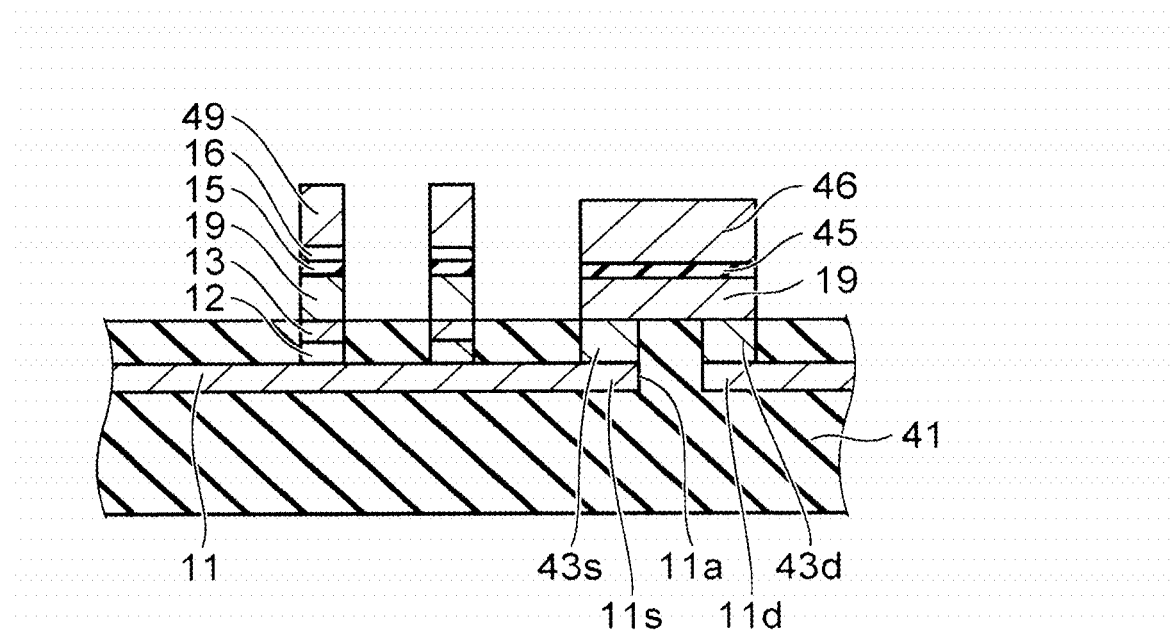

Continuing as shown in FIG. 12A, the gate electrode 46, the ion source electrode 16, the diffusion prevention layer 15, and the amorphous silicon layer 19 are patterned collectively such that the gate electrode 46, the ion source electrode 16, the diffusion prevention layer 15, and the amorphous silicon layer 19 remain only in the transfer gate transistor region and in the region where the memory cells 42 are to be formed (hereinbelow, the "memory cell region"). Hereinbelow, the diffusion prevention layer 15 remaining in the transfer gate transistor region is called the gate insulator film 45; the crystallization-inducing metal layer 13 remaining in the transfer gate transistor region is called the crystallization-inducing metal layers 43s and 43d; and the gate electrode 46 remaining in the memory cell region is called the interconnect 49.

Figure 12B:
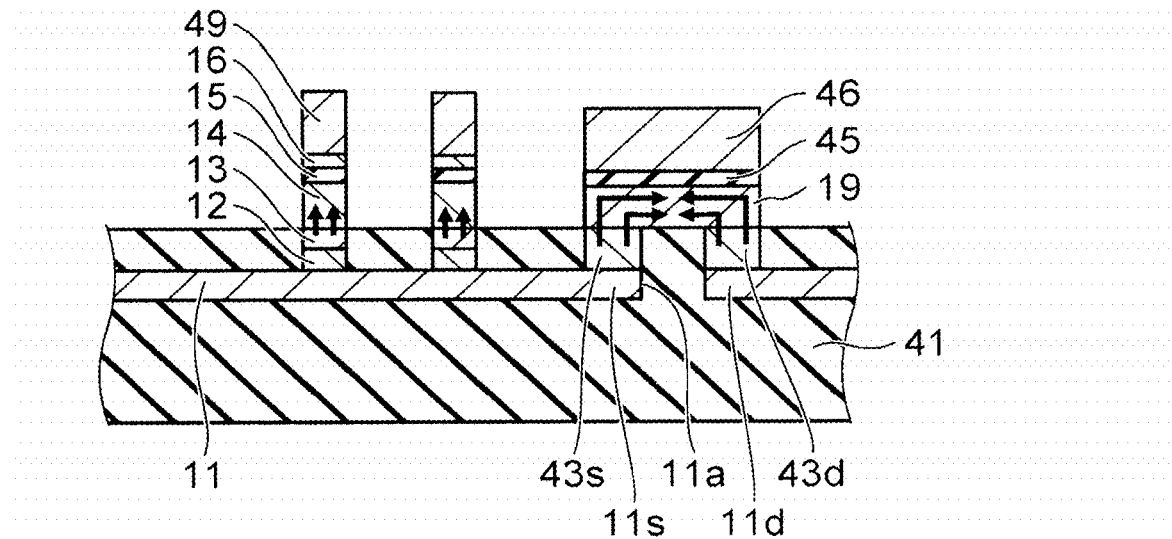

Then, as shown in FIG. 12B and FIG. 9, heat treatment is performed; and the crystallization of the amorphous silicon layer 19 is performed using the crystallization-inducing metal layers 13, 43s, and 43d as seeds of the crystallization. At this time, similarly to the first embodiment described above, because the crystallization of the amorphous silicon layer 19 progresses in the memory cell region by using the portion contacting the crystallization-inducing metal layer 13 as a starting point, the crystallization rate of the lower portion of the amorphous silicon layer 19 is higher than the crystallization rate of the upper portion of the amorphous silicon layer 19 by appropriately adjusting the temperature and time of the heat treatment. Thereby, the variable resistance film 14 described above is formed.

On the other hand, in the transfer gate transistor region, although the crystallization of the amorphous silicon layer 19 progresses by using portions at two locations contacting the crystallization-inducing metal layers 43s and 43d as starting points, the crystallization speed is high because much fluorine is included in the amorphous silicon layer 19. Therefore, when the heat treatment is performed in the memory cell region at conditions such that only the lower portion of the amorphous silicon layer 19 is crystallized, the entire amorphous silicon layer 19 is crystallized in the transfer gate transistor region. Thereby, the channel layer 44 is formed to contain fluorine and have a crystallization rate throughout the entirety that is higher than the crystallization rate of the upper portion 14b of the variable resistance film 14. Thus, the memory device 4 according to the embodiment is manufactured.

Operations of the memory device according to the embodiment will now be described.

In the memory device 4 according to the embodiment, the opposing electrodes 11 of the memory cells 42 are electrically connected to the source electrode 11s of the transfer gate transistor 47. Then, when programming and reading data to and from the memory cells 42, the voltage necessary for the programming operation or the read-out operation is supplied to the opposing electrodes 11 of the memory cells 42 by setting the transfer gate transistor 47 to the on-state.

Effects of the embodiment will now be described.

In the memory cell 42, similarly to the first embodiment described above, because the crystallization rate of the upper portion 14b of the variable resistance layer 14 is lower than the crystallization rate of the lower portion 14a of the variable resistance layer 14, the trade-off between the data retention characteristics and the data reset characteristics can be eliminated. On the other hand, in the transfer gate transistor 47, because the crystallization rate of the channel layer 44 is uniformly high and is high at the upper portion of the channel layer 44 in which most of the transistor current flows, the mobility of the electrons flowing through the channel layer 44 can be high; and a high current driving ability can be obtained. Therefore, the read-out speed and programming speed of the memory cells are high.

According to the embodiment, the crystallization-inducing metal layers 13 of the memory cells 42 and the crystallization-inducing metal layers 43s and 43d of the transfer gate transistor 47 are formed simultaneously; the variable resistance layers 14 of the memory cells 42 and the channel layer 44 of the transfer gate transistor 47 are formed simultaneously; the diffusion prevention layers 15 of the memory cells 42 and the gate insulator film 45 of the transfer gate transistor 47 are formed simultaneously; the interconnects 49 of the memory cells 42 and the gate electrode 46 of the transfer gate transistor 47 are formed simultaneously; and therefore, the processes are simple and the manufacturing cost is low.

Because fluorine is implanted selectively into only the portion of the amorphous silicon layer 19 formed in the transfer gate transistor region in the process shown in FIG. 11B, the crystallization in the channel layer 44 can be promoted more than in the variable resistance layer 14. Thereby, the crystallization rate of the upper portion of the channel layer 44 can be increased while limiting the crystallization rate of the upper portion 14b of the variable resistance layer 14 to be low. Thus, by providing different crystallization rate distributions of silicon between the transfer gate transistor 47 and the memory cells 42, both the memory performance and the transistor performance can be improved. Otherwise, the configuration, the manufacturing method, the operations, and the effects of the embodiment are similar to those of the first embodiment described above.

It is also possible to set the gate insulator film 45 of the transfer gate transistor 47 to be thicker than the diffusion prevention layers 15 of the memory cells 42 by additionally forming a silicon oxide layer only in the transfer gate transistor region. Thereby, the breakdown voltage of the transfer gate transistor 47 can be increased.

(Fifth Embodiment)

The embodiment differs from the fourth embodiment described above in that the crystallization-inducing metal layer exists on the source electrode of the transfer gate transistor, but the crystallization-inducing metal layer does not exist on the drain electrode. Otherwise, the embodiment is similar to the fourth embodiment; and common descriptions are omitted.

Figure 13:
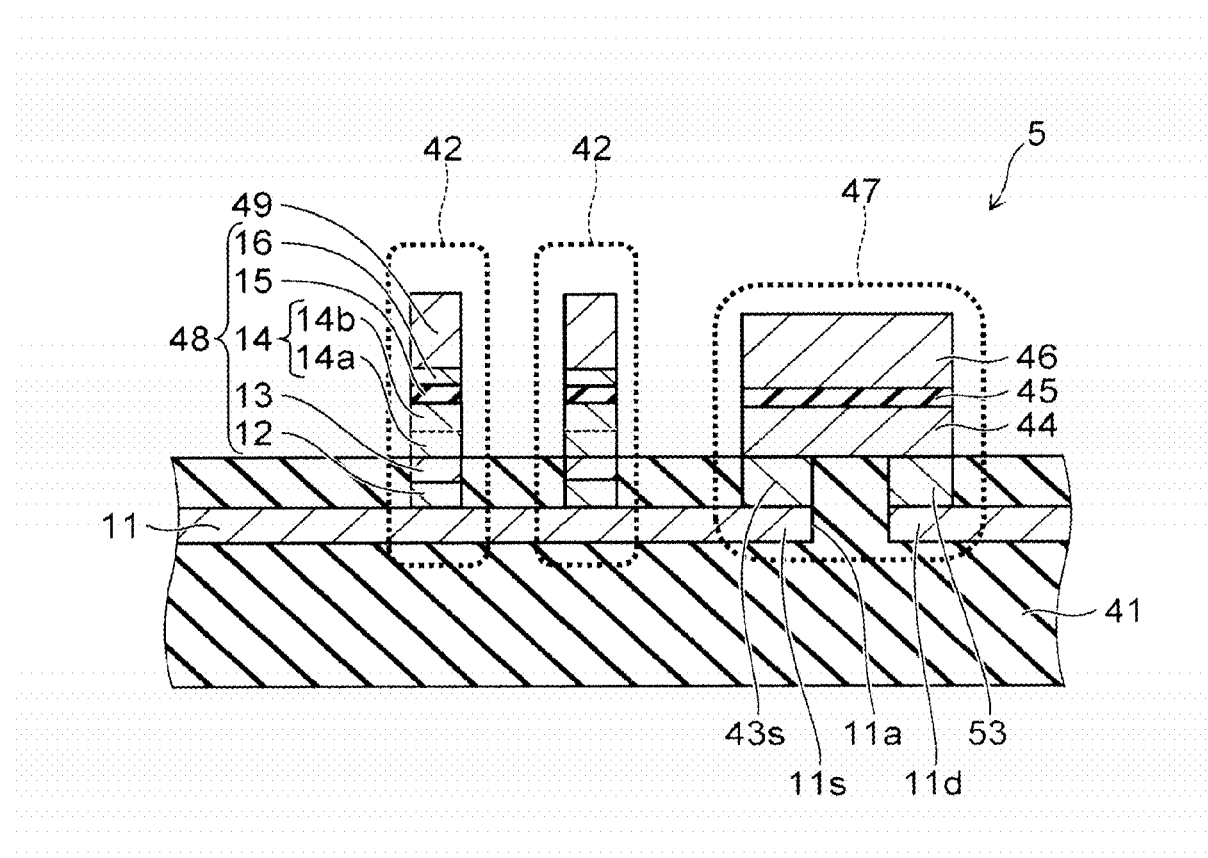
FIG. 13 is a cross-sectional view showing a memory device according to a fifth embodiment.

FIG. 13 is a cross-sectional view showing the memory device according to the embodiment.

In the memory device 5 according to the embodiment as shown in FIG. 13, the crystallization-inducing metal layer 43d (referring to FIG. 9) is not provided on the drain electrode 11d; and instead, a metal electrode 53 is provided. The metal electrode 53 does not have the property of inducing the crystallization of silicon. On the other hand, the crystallization-inducing metal layer 43s is provided in the region directly above the source electrode 11s. The crystal grains (not shown) of the channel layer 44 extend along a direction from the source electrode 11s side toward the drain electrode 11d side.

A method for manufacturing the memory device according to the embodiment will now be described.

Figure 14A:
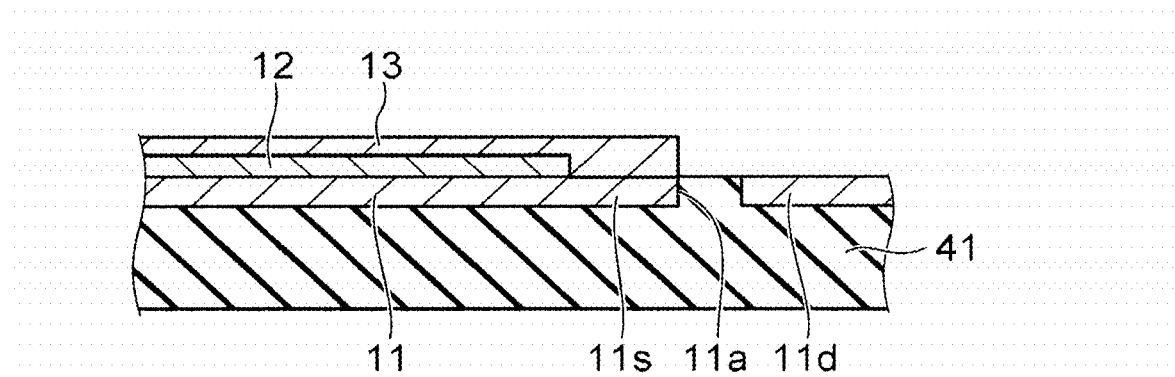
FIGS. 14A to 14C are cross-sectional views showing a method for manufacturing the memory device according to the fifth embodiment.
Figure 14B:
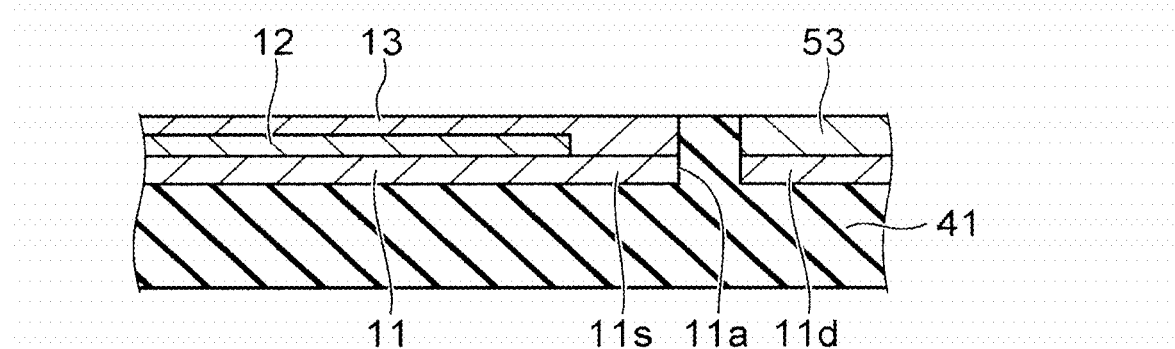
Figure 14C:
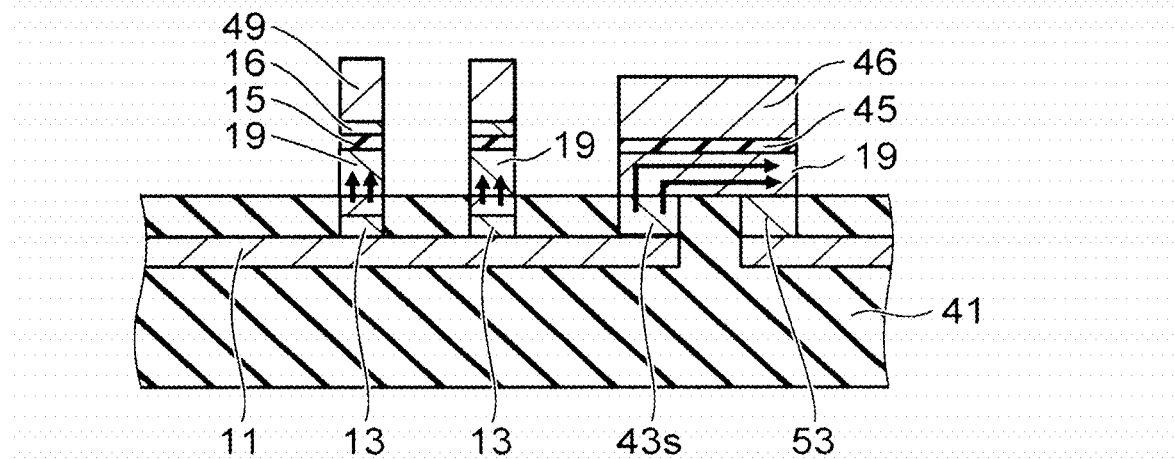

FIGS. 14A to 14C are cross-sectional views showing the method for manufacturing the memory device according to the embodiment.

First, the processes shown in FIGS. 10A and 10B are implemented.

Then, as shown in FIG. 14A, the crystallization-inducing metal layer 13 is formed; and the crystallization-inducing metal layer 13 is removed from the region of the transfer gate transistor region other than the region directly above the source electrode 11s by patterning. In other words, the crystallization-inducing metal layer 13 remains in the memory cell region and in the region directly above the source electrode 11s.

Continuing as shown in FIG. 14B, the metal electrode 53 is deposited; and the metal electrode 53 is removed from the regions other than the region directly above the drain electrode 11d by patterning. In other words, the metal electrode 53 remains in the region directly above the drain electrode 11d. Then, the inter-layer insulating film 41 is deposited further; and the upper surface is planarized.

Continuing, the processes shown in FIG. 11A to FIG. 12A are implemented.

Then, as shown in FIG. 14C, heat treatment is performed; and the amorphous silicon layer 19 is crystallized by using the crystallization-inducing metal layers 13 and 43s as seeds of the crystallization. At this time, in the transfer gate transistor region, the crystallization of the amorphous silicon layer 19 progresses by using only the portion contacting the crystallization-inducing metal layer 43s as a starting point. Therefore, the crystallization of the channel layer 44 grows in one direction from the source electrode 11s side toward the drain electrode 11d side. Thus, the memory device 5 according to the embodiment is manufactured.

Effects of the embodiment will now be described.

In the process shown in FIG. 14A of the embodiment, because the crystallization-inducing metal layer 43s is provided only in the region directly above the source electrode 11s, the crystals of the channel layer 44 grow in one direction from the source electrode 11s side toward the drain electrode 11d side in the heat treatment process shown in FIG. 14C. Thereby, in the interior of the channel layer 44, the crystal grain boundaries do not occur easily in orientations that obstruct the current flowing between the source electrode 11s and the drain electrode 11d.

Conversely, in the fourth embodiment described above, because the crystallization progresses from both the source electrode 11s side and the drain electrode 11d side, the efficiency of the crystallization is high; but crystal grain boundaries orthogonal to the current direction occur easily at the central portion of the channel layer 44. The crystal grain boundaries reduce the mobility of the electrons. Accordingly, according to the embodiment, compared to the fourth embodiment, higher mobility and a larger drive current can be obtained; and the read-out speed and programming speed of the data are high. Otherwise, the configuration, the manufacturing method, the operations, and the effects of the embodiment are similar to those of the fourth embodiment described above.

(Sixth Embodiment)

Figure 15:
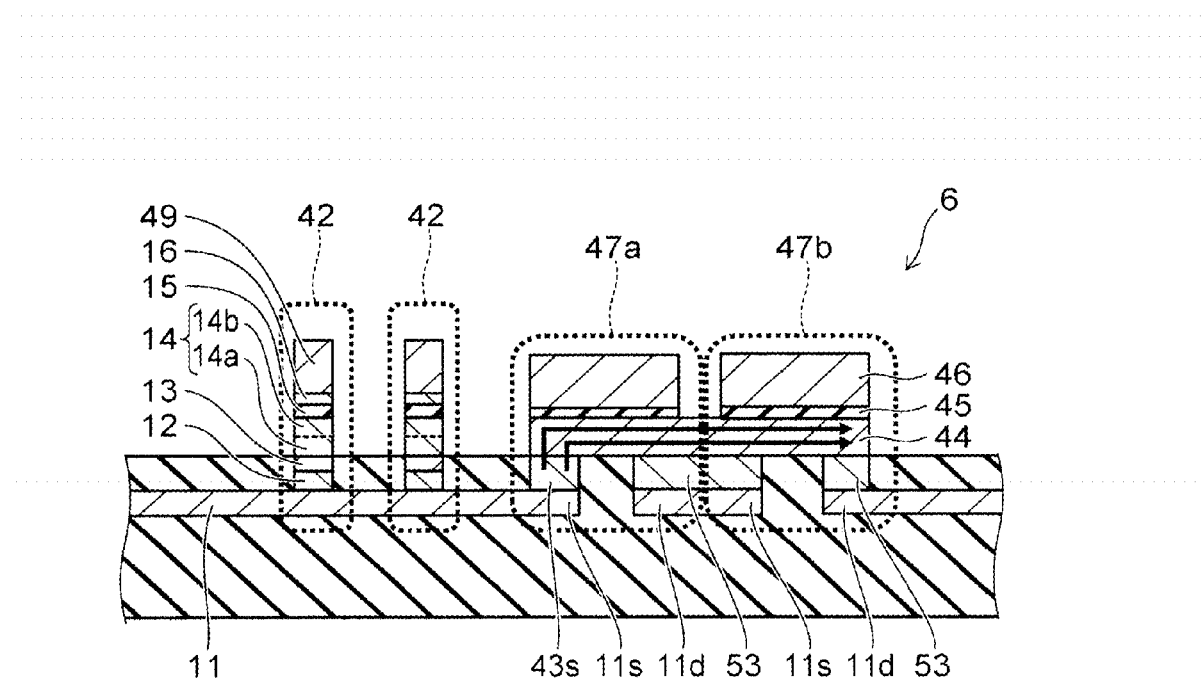
FIG. 15 is a cross-sectional view showing a memory device according to a sixth embodiment.

FIG. 15 is a cross-sectional view showing the memory device according to the embodiment.

In the memory device 6 according to the embodiment as shown in FIG. 15, two transfer gate transistors 47a and 47b that are connected to each other in series are provided; and one channel layer 44 is shared between the transfer gate transistors 47a and 47b. Then, the crystallization-inducing metal layer 43s is provided only in the region directly above the source electrode 115 of the transfer gate transistor 47a disposed on the memory cell 42 side; and in the region directly above the drain electrode 11d of the transfer gate transistor 47a, in the region directly above the source electrode 11s of the transfer gate transistor 47b, and in the region directly above the drain electrode 11d of the transfer gate transistor 47b, the crystallization-inducing metal layer is not provided and the metal electrode 53 is provided.

According to the embodiment, the crystallization of the channel layer 44 progresses in one direction from the portion of the transfer gate transistor 47a contacting the crystallization-inducing metal layer 43s toward the drain electrode 11d of the transfer gate transistor 47b. Therefore, crystal grain boundaries that obstruct the current inside the channel layer 44 shared by the transfer gate transistors 47a and 47b do not occur easily. In other words, continuous crystal grains are formed along the current direction in the channel layers 44 of the two transfer gate transistors 47a and 47b. As a result, the difference (the fluctuation) of the mobility characteristics, etc., between the two transistors is small.

Thereby, when forming an amplifier circuit (e.g., a sense amplifier for the memory read-out) using, for example, a current mirror made of the two transistors, high amplification performance is obtained because the difference of the characteristics between the transistors is small. Otherwise, the configuration, the manufacturing method, the operations, and the effects of the embodiment are similar to those of the fifth embodiment described above.

(Seventh Embodiment)

The embodiment is an example in which the transfer gate transistor and the memory cells of the fourth embodiment described above are stacked.

Figure 16:
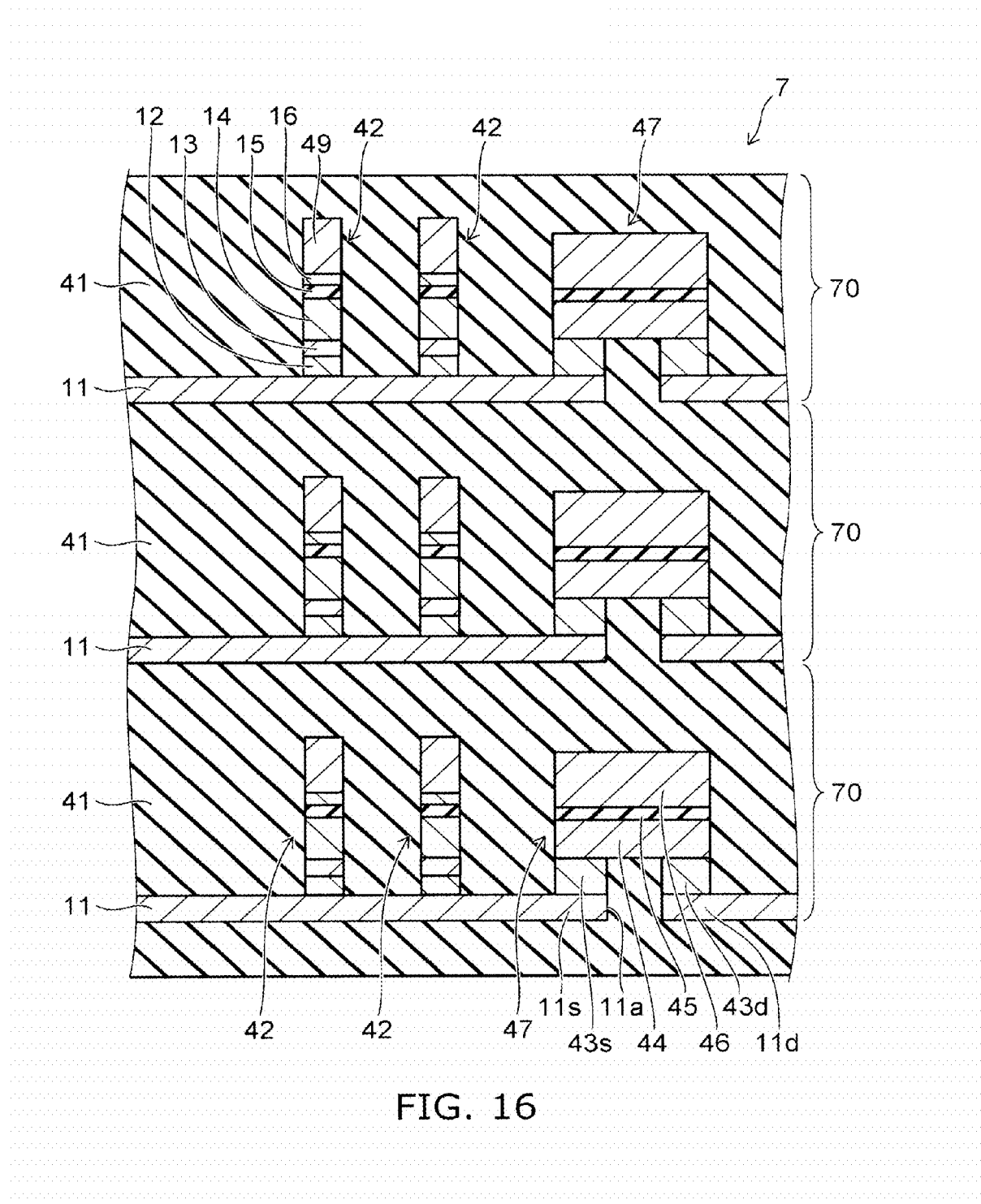
FIG. 16 is a cross-sectional view showing a memory device according to a seventh embodiment.

FIG. 16 is a cross-sectional view showing the memory device according to the embodiment.

As shown in FIG. 16, multiple layers of interconnect layers 70 are stacked in the memory device 7 according to the embodiment. The configuration of the memory device 4 according to the fourth embodiment described above is realized inside each of the interconnect layers 70. The opposing electrodes 11 that have interconnect configurations are multiply provided inside each of the interconnect layers 70. The opposing electrodes 11 are arranged parallel to each other along a direction perpendicular to the page surface of FIG. 16. Then, the memory cells 42 and the transfer gate transistor 47 are provided on each of the opposing electrodes 11.

In the embodiment, the bit density of the memory cells per unit surface area can be increased by stacking multiple layers of the interconnect layers 70. The amorphous silicon layers 19 of the interconnect layers 70 can be crystallized collectively by not performing heat treatment when forming each of the interconnect layers 70 but by performing heat treatment only once after all of the interconnect layers 70 are stacked. Thereby, the manufacturing cost can be greatly reduced because the number of manufacturing processes of the memory device 7 can be drastically reduced. In such a case, the metal portions included in each of the interconnect layers 70 do not degrade because the crystallization heat treatment can be performed at a low temperature of about 350 to 400° C. In particular, the diffusion of the silver of the ion source electrode 16 can be suppressed. Otherwise, the configuration, the manufacturing method, the operations, and the effects of the embodiment are similar to those of the fourth embodiment described above.

(Test Example)

A test example will now be described.

Figure 17A:
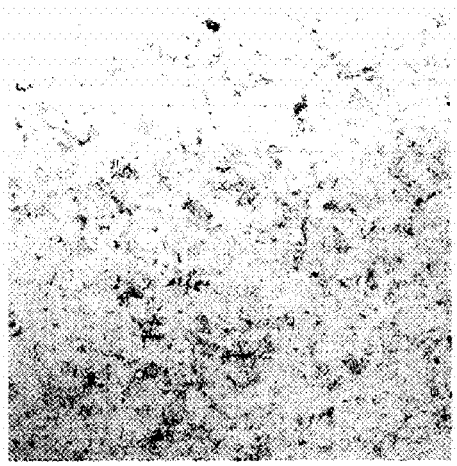
FIG. 17A is a plane TEM (transmission electron microscopy) photograph of a polycrystalline silicon layer.
Figure 17B:
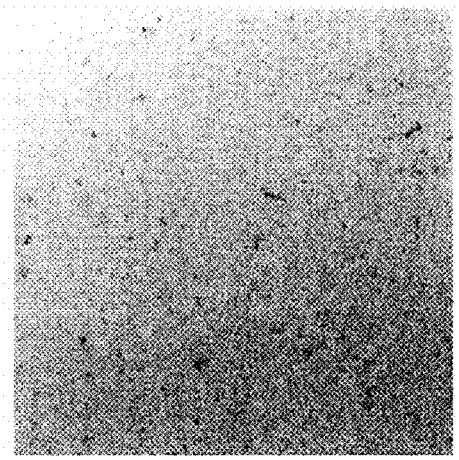
FIG. 17B is a plane TEM photograph of an amorphous silicon layer.

FIG. 17A is a plane TEM photograph of a polycrystalline silicon layer; and FIG. 17B is a plane TEM photograph of an amorphous silicon layer.

A memory device having a configuration similar to that of the memory device 1 according to the first embodiment described above in which the polycrystalline silicon layer shown in FIG. 17A is used as the variable resistance layer was prototyped; a memory device having a configuration similar to that of the memory device 1 in which the amorphous silicon layer shown in FIG. 17B is used as the variable resistance layer was prototyped; and the data retention characteristics were evaluated. As a result, the retention characteristics of the low resistance state were better for the memory device in which the polycrystalline silicon layer was used as the variable resistance layer than for the memory device in which the amorphous silicon layer was used as the variable resistance layer.

According to the embodiments described above, a memory device that provides both good data retention characteristics and ease of resetting data can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
a first electrode;
a second electrode including a metal, the metal being more easily ionizable than a material of the first electrode; and
a variable resistance layer disposed between the first electrode and the second electrode,
the variable resistance layer including:
a first layer having a first crystallization rate;
a second layer having a second crystallization rate lower than the first crystallization rate; and
an oxide layer disposed between the first layer and the second layer,
the first layer, the oxide layer, and the second layer being stacked along a direction connecting the first electrode and the second electrode.

2. The device according to claim 1, further comprising a metal layer disposed between the first electrode and the variable resistance layer, the metal layer including nickel,
the first layer being nearer to the first electrode than the second layer,
the variable resistance layer including silicon,
the second electrode including silver.

3. The device according to claim 1, wherein the first layer and the second layer include silicon, and the oxide layer includes silicon and oxygen.

4. The device according to claim 1, wherein the crystallization rate of the first layer is at least 10% higher than the crystallization rate of the second layer.

5. The device according to claim 1, wherein the variable resistance layer includes silicon.

6. The device according to claim 5, wherein
an oxygen concentration in the oxide layer is higher than an oxygen concentration in the first layer, and
the oxygen concentration in the oxide layer is higher than an oxygen concentration in the second layer.

7. The device according to claim 1, wherein the second electrode includes at least one selected from the group consisting of silver, nickel, cobalt, aluminum, and copper.

8. The device according to claim 1, wherein a distance between the first electrode and the first layer is shorter than a distance between the first electrode and the second layer.

9. The device according to claim 1, further comprising a metal layer disposed between the first electrode and the variable resistance layer, the metal layer including a metal more difficult to ionize than a material of the second electrode.

10. The device according to claim 9, wherein the metal layer includes at least one selected from the group consisting of nickel, aluminum, and palladium.

11. The device according to claim 1, wherein an oxygen concentration, a nitrogen concentration, or a total concentration of oxygen and nitrogen in the second layer is higher than an oxygen concentration, a nitrogen concentration, or a total concentration of oxygen and nitrogen in the first layer.

12. The device according to claim 1, further comprising an insulating layer provided between the variable resistance layer and the second electrode.

* * * * *